United States Patent
Chang et al.

(10) Patent No.: US 7,863,196 B2
(45) Date of Patent: Jan. 4, 2011

(54) SELF-ALIGNED DIELECTRIC CAP

(75) Inventors: Hulin Chang, Hsinchu (TW); Yung-Cheng Lu, Taipei (TW); Syun-Ming Jang, Hsin-Chu (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 406 days.

(21) Appl. No.: 11/747,105

(22) Filed: May 10, 2007

(65) Prior Publication Data

US 2008/0280449 A1 Nov. 13, 2008

(51) Int. Cl.
*H01L 21/311* (2006.01)

(52) U.S. Cl. .............. 438/703; 438/699; 257/E21.311

(58) Field of Classification Search ............ 438/703, 438/699, 720, 724; 257/774, 758, 780
See application file for complete search history.

(56) References Cited

U.S. PATENT DOCUMENTS

| | | | |
|---|---|---|---|
| 6,174,810 B1 | 1/2001 | Islam et al. | |
| 6,274,499 B1 * | 8/2001 | Gupta et al. | 438/692 |
| 7,276,441 B1 * | 10/2007 | Cui et al. | 438/654 |
| 2004/0056319 A1 | 3/2004 | Kuo et al. | |
| 2006/0281299 A1 * | 12/2006 | Chen et al. | 438/622 |
| 2008/0254600 A1 * | 10/2008 | Liu et al. | 438/494 |

OTHER PUBLICATIONS

Chinese Patent Office, Office Action mailed May 8, 2009, in Application No. 2007103059191, 5 pages.
Chinese Patent Office, Office Action mailed Jan. 8, 2010, Patent Application No. 2007/103059191, 6 pages.

* cited by examiner

*Primary Examiner*—Phat X Cao
*Assistant Examiner*—Nga Doan
(74) *Attorney, Agent, or Firm*—Haynes and Boone, LLP

(57) ABSTRACT

A method of forming a dielectric layer includes providing a substrate that has a copper region and a non-copper region. The substrate is etched to remove any copper oxides from the copper region. A dielectric cap is then selectively formed over the copper region of the substrate so that little or no dielectric cap is formed over the non-copper region of the substrate.

20 Claims, 7 Drawing Sheets

SELF-ALIGNED DIELECTRIC CAP

BACKGROUND

Semiconductor manufacturers are increasingly using copper, instead of aluminum or other metals, to make conductive interconnections between semiconductor components. Using copper, however, has the downside of increased electromigration of metal atoms, which can cause circuit failure.

BRIEF DESCRIPTION OF THE DRAWINGS

The present disclosure is best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion. Furthermore, all features may not be shown in all drawings for simplicity.

DETAILED DESCRIPTION

The present disclosure relates generally to semiconductor manufacturing and a method of depositing a dielectric material on a metal. It is understood, however, that the following disclosure provides many different embodiments, or examples, for implementing different features of the invention. Specific examples of components and arrangements are described below to simplify the present disclosure. These are, of course, merely examples and are not intended to be limiting.

Figure 1:
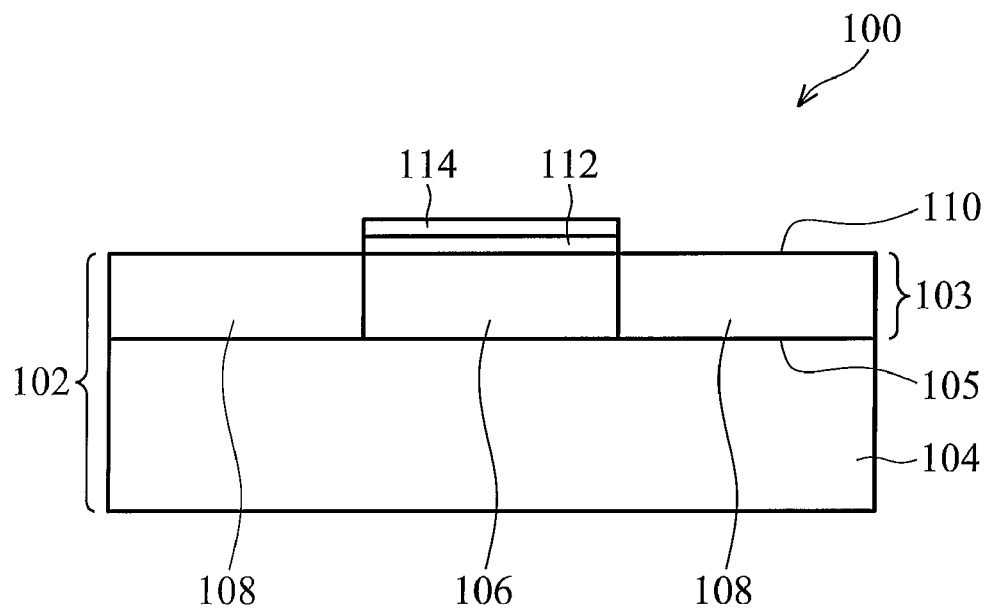
FIG. 1 illustrates a cross-sectional view of one embodiment of a dielectric cap formed over a substrate.

Referring to FIG. 1, illustrated is a cross-sectional view of one embodiment of a dielectric cap formed over a substrate. A structure 100 includes a substrate 102, which may be a partially fabricated semiconductor wafer and may include silicon, silicon-on-insulator, silicon with defective crystalline, and/or diamond or other suitable materials. The substrate 102 may also be based on non-silicon semiconductor chemistry, such as gallium arsenide. The substrate 102 may contain multiple layers.

The substrate 102 has a base 104, which may include fabricated or partially fabricated semiconductor devices (not illustrated). For example, the base 104 may include or contain partially or fully fabricated semiconductor structures, including but not limited to gates, transistors, trenches, and metal interconnects. On one side of base 104 is an interface 105, and formed over interface 105 is an interconnect layer 103, which includes a metal interconnect 106. The metal interconnect 106 may be a metal suitable for forming interconnections between two locations in a semiconductor device, such as copper or a copper alloy. Although FIG. 1 illustrates only a single metal interconnect 106, it is understood that interconnect layer 103 may have numerous such interconnections. Moreover, a semiconductor device may have multiple interconnect layers. Surrounding the metal interconnect 106 on top of base 104 is a dielectric 108, which may serve to electrically insulate metal interconnect 106 from other structures (not illustrated) in base 104 or interconnect layer 103. The dielectric 108 may be doped or undoped silicon dioxide, SiC, CN, SiOC, or any other suitable dielectric material. In one embodiment, the dielectric 108 is a low-k silicon dioxide.

FIG. 1 illustrates that substrate 102 further has an interface 110, portions of which may be exposed and portions of which may be in contact with another semiconductor layer. The interface 110 may be substantially planar, like an interface surface formed by a chemical mechanical polishing process. Above metal interconnect 106 and at interface 110, the structure 100 includes a dielectric cap 112. The dielectric cap 112 may form an electrically insulating layer over the electrically conductive metal interconnect 106. In one embodiment, the dielectric cap 112 is silicon carbide. In another embodiment, the dielectric cap 112 is silicon nitride. In still another embodiment, the dielectric cap 112 is silicon carbon nitride. In some embodiments, the dielectric cap is a material that is substantially impermeable to the electromigration, stress migration, or both of copper atoms, thus reducing the probability that copper atoms from the metal interconnect 106 will migrate over time or during the operation of the semiconductor structure 100 and cause a device failure.

The structure of FIG. 1 also includes an etch stop layer 114 formed over the dielectric cap 112. The etch stop layer 114 may prevent etching of the dielectric cap 112 or the metal interconnect 106 during later semiconductor fabrication steps. In some embodiments, etch stop layer 114 may be silicon nitride, silicon carbide, or silicon carbon nitride. The etch stop layer 114 may be the same composition as the dielectric cap 112, or it may be different.

Figure 2:
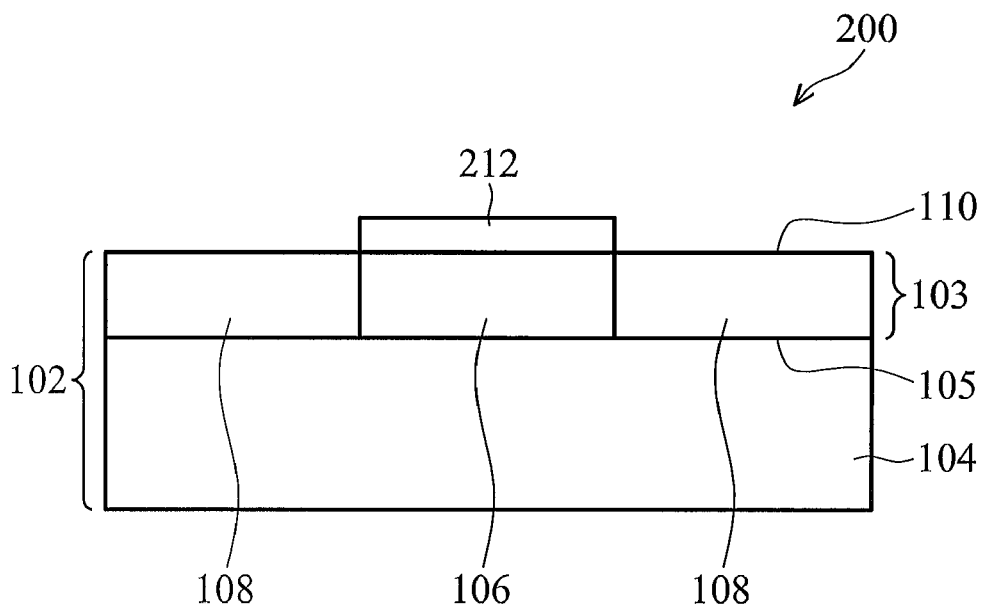
FIG. 2 illustrates a cross-sectional view of another embodiment of a dielectric cap formed over a substrate.

FIG. 2 illustrates a cross-sectional view of a structure 200 showing another embodiment of a dielectric cap. Some components of FIG. 2 are the same as in FIG. 1 and a detailed description will not be repeated. FIG. 2 shows that a dielectric cap 212 is formed over metal interconnect 106. The dielectric cap 212 may form an electrically insulating layer over the electrically conductive metal interconnect 106. In one embodiment, the dielectric cap 212 is silicon carbide. In another embodiment, the dielectric cap 212 is silicon nitride. In still another embodiment, the dielectric cap 212 is silicon carbon nitride. In some embodiments, the dielectric cap is a material that is substantially impermeable to the electromigration, stress migration, or both of copper atoms, thus reducing the probability that copper atoms from the metal interconnect 106 will migrate over time or during the operation of the semiconductor structure 200 and cause a device failure.

Figure 3A:
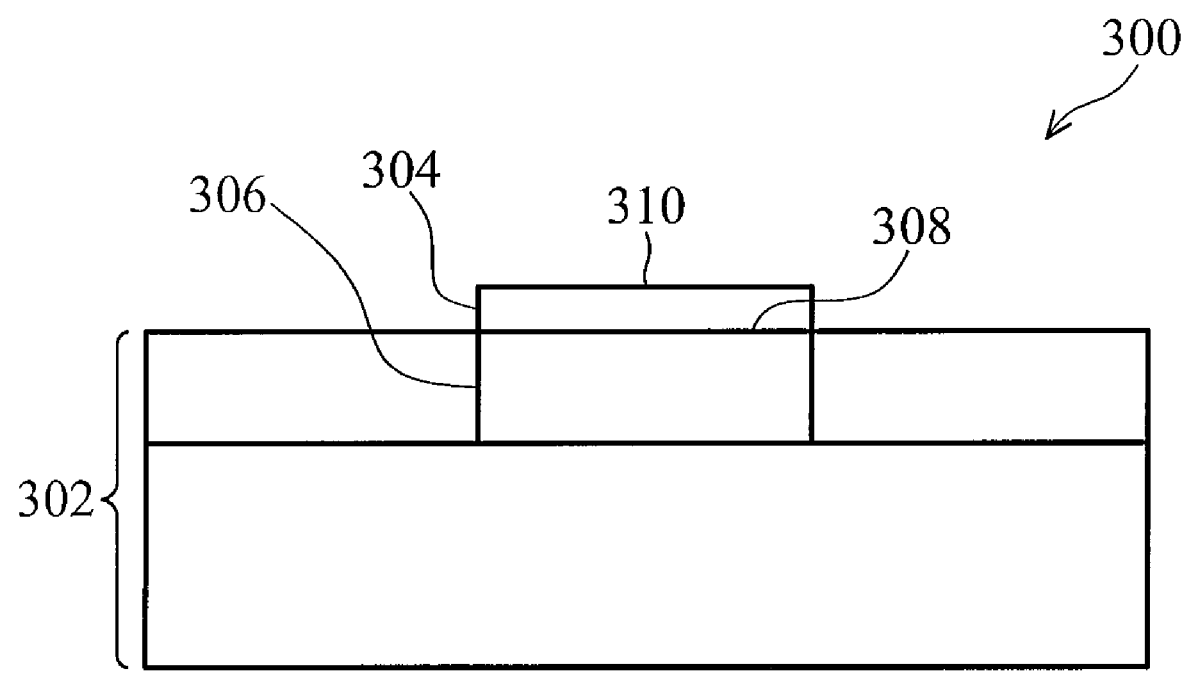
FIG. 3 illustrates a dielectric cap having a compositional gradient.
Figure 3B:
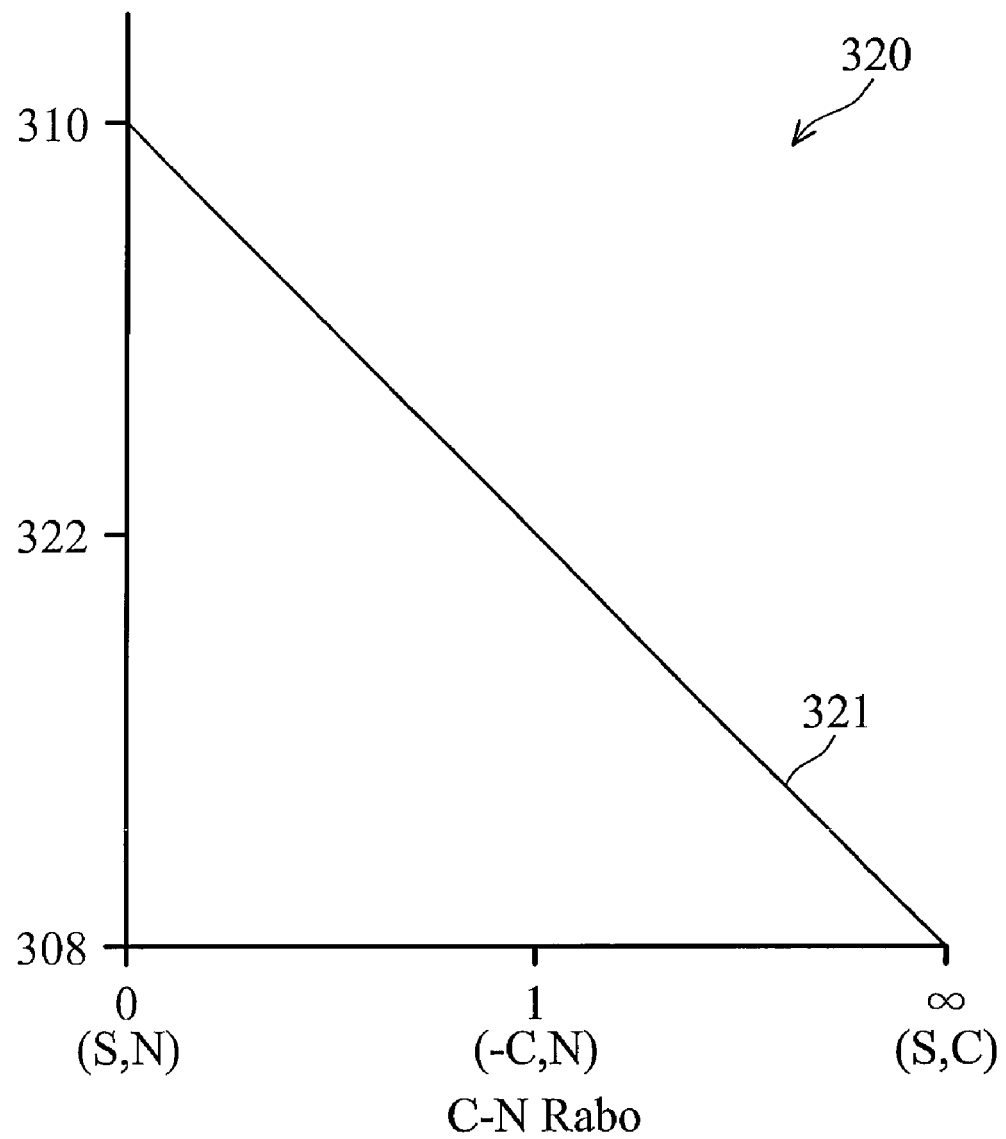

FIGS. 3a-3b illustrate a dielectric cap having a compositional gradient. FIG. 3a illustrates a structure 300 that includes a substrate 302 with a dielectric cap 304 formed over an interconnect 306. The dielectric cap 304 may have a compositional profile. For instance, the dielectric cap 304 may have a composition that is substantially silicon carbide at an interface 308 with metal interconnect 306 and a composition that is substantially silicon nitride at a second interface 310. In between the two interfaces, the composition of the dielectric cap 304 may gradually change or may change rapidly. The dielectric cap 304 may also be of substantially uniform composition.

In FIG. 3b, a graph 320 shows one example of how the ratio of carbon to nitrogen may vary from interface 308 to interface 310. The graph 320 includes a profile line 321 that correlates locations within cap 304 to chemical compositions. A profile line 321 shows that at interface 308, the carbon-to-nitrogen ratio is infinity, indicating that no nitrogen is present. Thus the chemical composition of the dielectric cap 304 at interface 308 is substantially SiC. At an intermediate location 322, the carbon-to-nitrogen ratio is one, indicating that the chemical composition at location 322 is substantially SiCN. Finally, at interface 310, the carbon-to-nitrogen ratio is zero, indicating that no carbon is present and that the chemical composition is substantially SiN.

It is understood that graph 320 is merely one example of a compositional profile, and that the present disclosure also contemplates other compositional profiles. A graph of the compositional profile could, for instance, be a step graph, parabolic graph, exponential graph, logarithmic graph, polynomial graph, a combination of them, or any other graph. Furthermore, the carbon-to-nitrogen ratio at interfaces 308 and 310 may be any value.

Figure 4A:
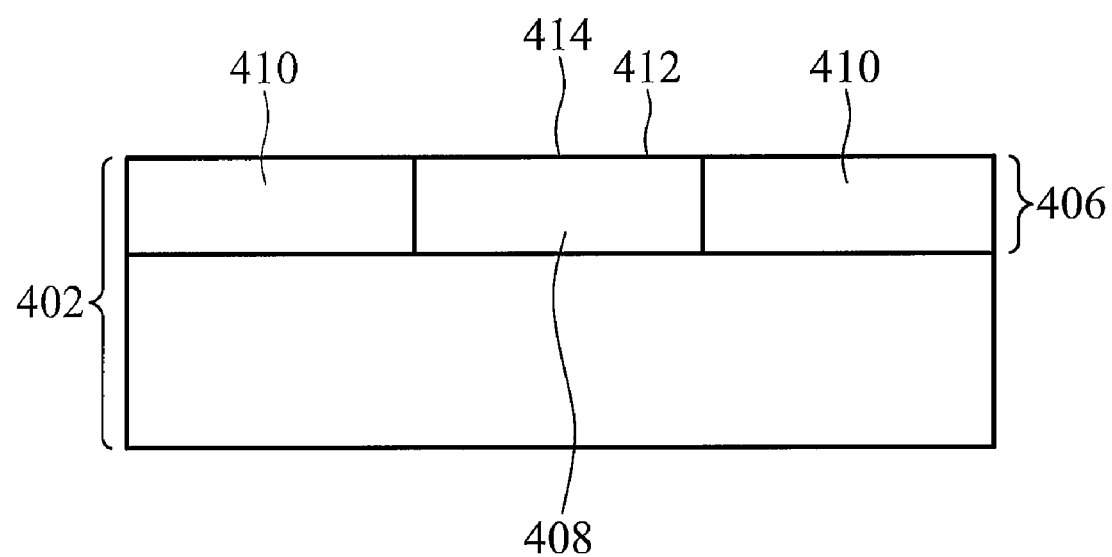
FIG. 4 illustrates multiple cross-sectional views of a partial semiconductor device during fabrication.

FIGS. 4a-4d illustrate multiple cross-sectional views of a partial semiconductor device during fabrication. FIG. 4a shows a substrate 402 that includes a base 404. For example, the base 404 may be a partially fabricated semiconductor wafer and may have multiple layers (not shown). The base 404 may contain embedded semiconductor devices, such as gates, transistors, trenches, and metal interconnects (not shown). The substrate 402 also includes an interconnect layer 406 formed over base 404. The interconnect layer 406 may include a metal interconnect pattern 408 formed in a dielectric 410. The dielectric 410 may be the same or a different material as the base 404. The metal interconnect pattern 408 may be copper, a copper alloy, or any other suitable conductive material. The remaining disclosure will continue with the example of a copper metal interconnect layer 406.

The interconnect layer 406 is a copper damascene layer formed by a dual damascene process followed by chemical mechanical polishing. Pattern 408 has an exposed surface 412, which may include some copper oxides 414, such as cupric oxide or cuprous oxide. Copper oxides 414 may have formed naturally by the reaction of copper in pattern 408 with atmospheric oxygen (not shown).

Figure 4B:
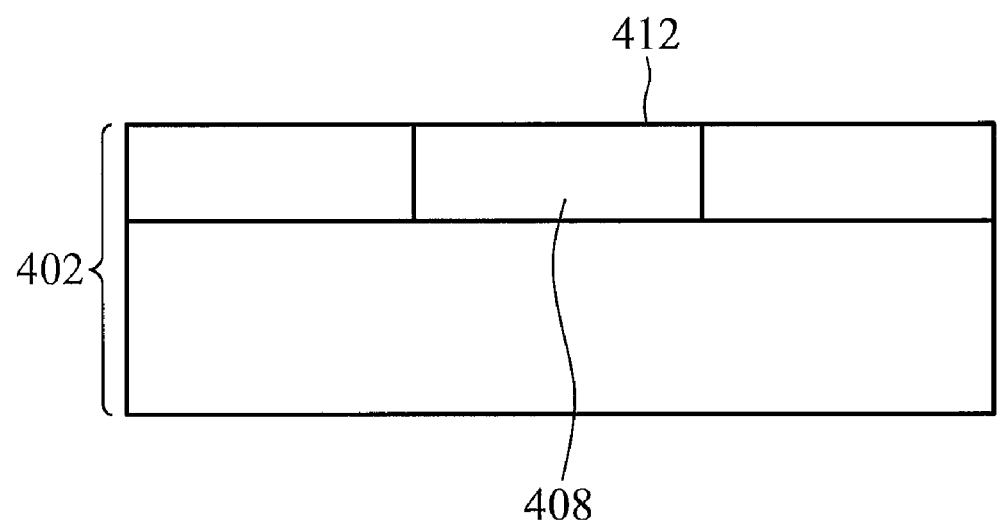

FIG. 4b shows that the substrate 402 with an exposed surface 412 that is free of oxidized copper at the pattern 408. The copper oxides 414 shown in FIG. 4a may have been removed using a etching process, for instance, a plasma etch using a chemical reducing agent such as $H_2$, $NH_3$, and $N_2NH_3$.

Figure 4C:
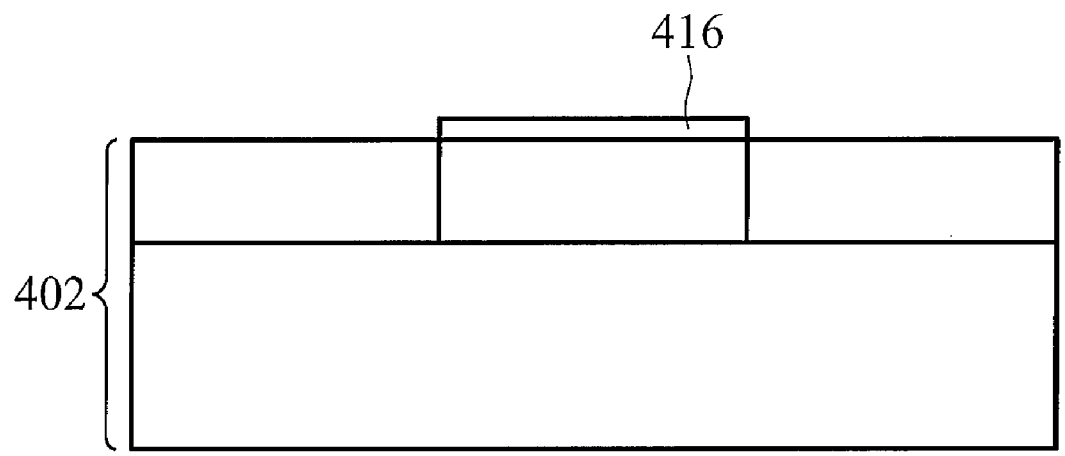

FIG. 4c illustrates the substrate 402 having a dielectric cap 416 formed over pattern 408. The dielectric cap 416 may be composed of silicon carbide, silicon nitride, silicon carbon nitride, or any other suitable dielectric material. In some embodiments, the dielectric cap 416 may be formed in the same tool as was used to etch off the copper oxides 414. In one embodiment, the dielectric cap 416 is formed using chemical vapor deposition (CVD) of a carbon- or nitrogen-containing precursor, or both, together with a silane gas. For instance, the dielectric cap 416 may be formed using CVD of $SiH_4$, $Si_2H_6$, or $Si_3H_8$ with one or more of: $CH_4$, $C_2H_6$, $C_3H_8$, $N_2$, $NH_3$, or $N_2NH_3$. These compounds may be of electronic grade and of high purity.

Figure 4D:
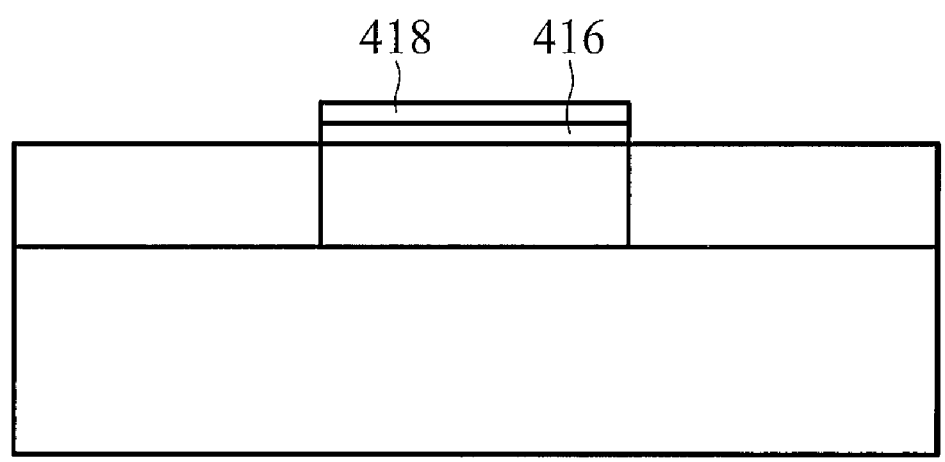

FIG. 4d illustrates etch stop layer 418 formed over dielectric cap 416. The etch stop layer 418 may be a dielectric material such as silicon carbide, silicon nitride, silicon carbon nitride, or any other material that resists etching in subsequent processing. The etch stop layer 418 may be the same or a different material as the dielectric cap 416. In some embodiments, the etch stop layer 418 may be formed in the same tool as was used to form the dielectric cap 416. In some embodiments, a single tool may be used to etch the substrate 402, form the dielectric cap 416, and form the etch stop layer 418. In some other embodiments, the etch stop layer 418 may not be formed over the dielectric cap 416. In such embodiments without the etch stop layer 418, the dielectric cap 416 may act as an etch stop layer in subsequent processing, or subsequent semiconductor fabrication steps may not require an etch stop layer.

Figure 5:
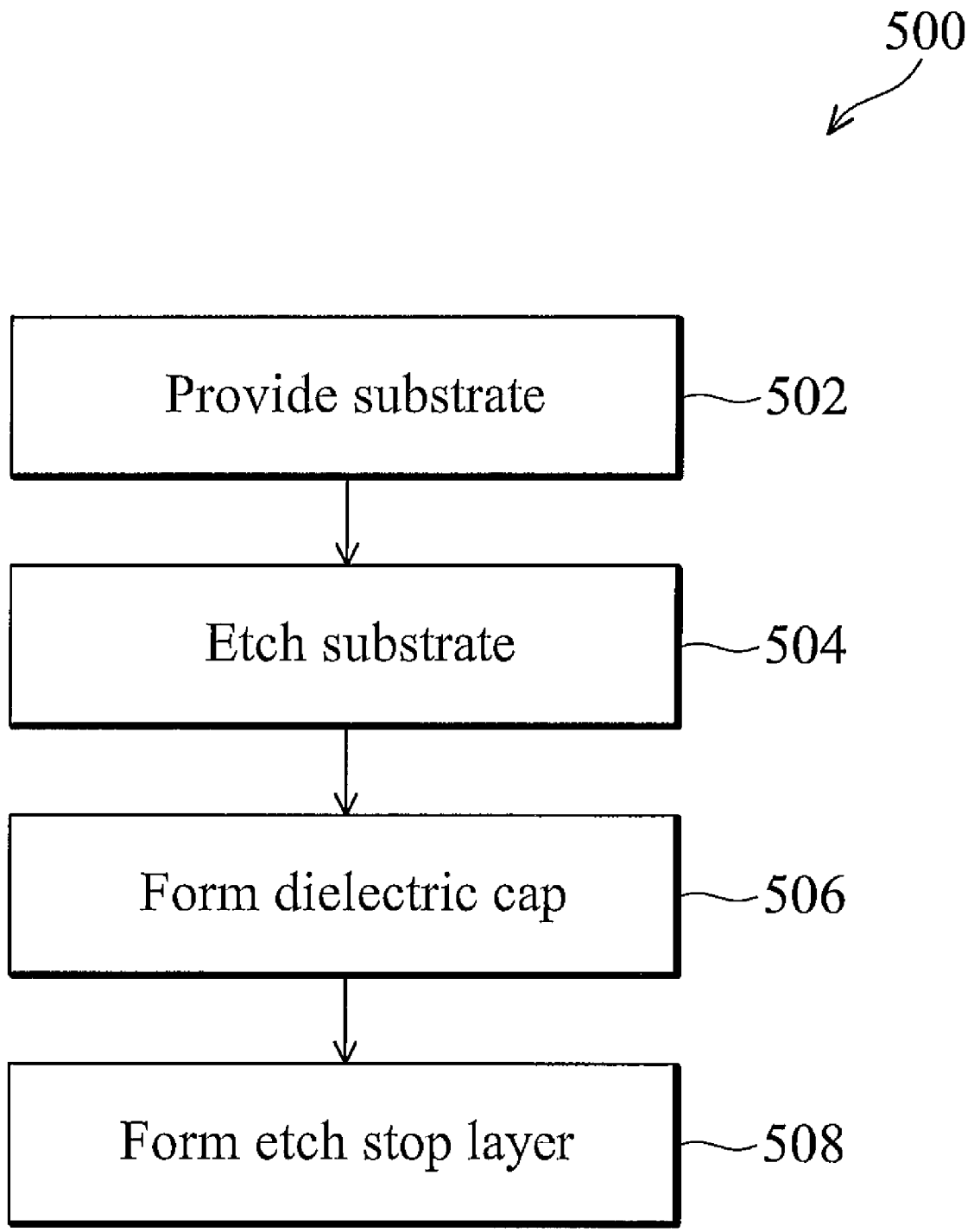
FIG. 5 illustrates a method in accordance with one embodiment of forming a dielectric cap.

FIG. 5 illustrates an exemplary method 500 for forming a dielectric cap. The method 500 begins at step 502 with providing a substrate. The substrate may be a partially fabricated semiconductor wafer. For instance, the substrate may be a silicon wafer that has been processed to include transistors and associated wiring circuitry. The provided substrate may have an exposed surface that is substantially planar, such as a surface produced by chemical mechanical polishing. An exposed surface of the substrate may have regions that contain copper and other regions that contain a dielectric material. For instance, the substrate may have recently completed a dual damascene process followed by chemical mechanical polishing. Together, the copper-containing regions and the dielectric regions may constitute an interconnect layer of metal wiring that electrically connects one or more locations on a lower layer in the substrate to one or more other locations on the same or a different layer of the substrate.

In one embodiment, the copper-containing regions of the substrate's interconnect layer are copper. In another embodiment, the copper-containing regions may be a copper alloy. The dielectric regions may be silicon dioxide, doped silicon dioxide, or any other suitable material for electrically insulating the metal wiring paths of the interconnect layer. In one embodiment, the dielectric is a low-k silicon dioxide formed by implanting.

The method 500 continues in step 504 with treating the exposed surface of the substrate to remove any copper oxides. Because elemental copper readily reacts with atmospheric oxygen to form cuprous oxide and cupric oxide, a layer of copper oxides will naturally begin to form on the copper-containing regions of the exposed substrate surface. To remove these copper oxides, the substrate may be treated, for instance, by etching. The etching process may be sufficient to remove substantially all oxygen atoms from the copper-containing regions. In one embodiment, the substrate surface may be etched using a wet chemical etch. In another embodiment, the substrate surface may be etched using a plasma etch in an atmosphere that is substantially free of oxygen. The atmosphere may include $H_2$, $N_2NH_3$, $NH_3$, or any other suitable reducing agent. The atmosphere may also include an inert gas, for instance, argon. The etching may be performed using a total atmospheric pressure between about 1 mtorr and about 10 torr. The processing temperature may be between about 200° C. and about 400° C., and the substrate may be etched for a period between about 5 seconds and about 120 seconds. In another embodiment, the etching time, temperature, and pressure are varied according to the length of time the substrate has been exposed to atmospheric oxygen. For instance, the etch time may be increased when a long period of time has passed since the substrate exited a previous processing step.

The method 500 then continues in step 506, where a dielectric cap is formed. The dielectric cap may be formed almost exclusively over the copper-containing regions of the substrate so that the remaining portions of the exposed surface are not capped. For instance, the dielectric cap may not be formed over the dielectric regions of the exposed surface.

The dielectric cap may be formed using chemical vapor deposition (CVD), plasma enhanced chemical vapor deposition, or any other suitable semiconductor fabrication technology. The dielectric cap may be formed in step 506 using the same semiconductor fabrication tool as used to perform the etching in step 504, or it may be formed using a different tool. By using the same tool for steps 504 and 506, processing time may be reduced and there may be less opportunity for oxygen to react with the copper wiring to reform copper oxides.

The dielectric cap may be silicon nitride, silicon carbide, silicon carbon nitride, or any other suitable dielectric compound. A silicon nitride cap may be formed using CVD in an atmosphere that includes a silicon precursor and a nitrogen precursor. The CVD may be plasma enhanced. The silicon precursor may be a silane, for instance, $SiH_4$, $Si_2H_6$, or $Si_3H_8$. The nitrogen precursor may be, for instance, $N_2$, $NH_3$, $N_2NH_3$, or another suitable compound that contains nitrogen. The atmosphere may also include an inert gas, such as argon. The deposition may be performed using a total atmospheric pressure between about 1 mtorr and about 10 torr. The processing temperature may be between about 200° C. and about 400° C., and the substrate may be processed for a period between about 5 seconds and about 120 seconds.

In another embodiment, the dielectric cap may be silicon carbide. A silicon carbide cap may be formed using CVD in an atmosphere that includes a silicon precursor and a carbon precursor. The CVD may be plasma enhanced. The silicon precursor may be a silane, for instance, $SiH_4$, $Si_2H_6$, or $Si_3H_8$. The carbon precursor may be an alkane, for instance, $CH_4$, $C_2H_6$, or $C_3H_8$. The atmosphere may also include an inert gas, such as argon. The deposition may be performed using a total atmospheric pressure between about 1 mtorr and about 10 torr. The processing temperature may be between about 200° C. and about 400° C., and the substrate may be processed for a period between about 5 seconds and about 120 seconds.

In yet another embodiment, the dielectric cap may be silicon carbon nitride. A silicon carbon nitride cap may be formed using CVD in an atmosphere that includes a silicon precursor, a carbon precursor, and a nitrogen precursor. The CVD may be plasma enhanced. The silicon precursor may be, for instance, $SiH_4$, $Si_2H_6$, or $Si_3H_8$. The nitrogen precursor may be, for instance, $N_2$, $NH_3$, or $N_2NH_3$. The carbon precursor may be an alkane, for instance, $CH_4$, $C_2H_6$, or $C_3H_8$. In some embodiments, two or more of the precursors may be the same compound, for instance, tetramethylsilane may be used as both a silicon precursor and a carbon precursor. The atmosphere may also include an inert gas, such as argon. The CVD may be performed using a total atmospheric pressure between about 1 mtorr and about 10 torr. The processing temperature may be between about 200° C. and about 400° C., and the substrate may be processed for a period between about 5 seconds and about 120 seconds.

The method 500 continues in step 508 with forming an etch stop layer. The etch stop layer may prevent removal or thinning of the dielectric cap during subsequent processing steps (not shown). The etch stop layer may be silicon nitride, silicon carbide, silicon carbon nitride, or any other suitable compound that resists etching. The etch stop layer may be formed using a process similar to that used in step 506 for forming the dielectric cap, or the etch stop layer may be formed using a different process. The etch stop layer may be formed from a compound that contains both carbon and silicon, such as tetramethylsilane ($Si(CH_3)_4$) or trimethylsilane ($SiH(CH_3)_3$). The processing atmosphere may further include other carbon or nitrogen compounds, such as $CO_2$, $NH_3$ or $N_2$. In some embodiments, the composition of the etch stop layer may be varied from a lower interface with the dielectric cap to an upper interface. Such a compositional variance may be achieved by varying the composition of the atmosphere during the formation of the etch stop layer. The etch stop layer may be formed substantially only over the dielectric cap, or it may be formed over the entire exposed surface of the substrate. After step 508, the method 500 ends.

Figure 6:
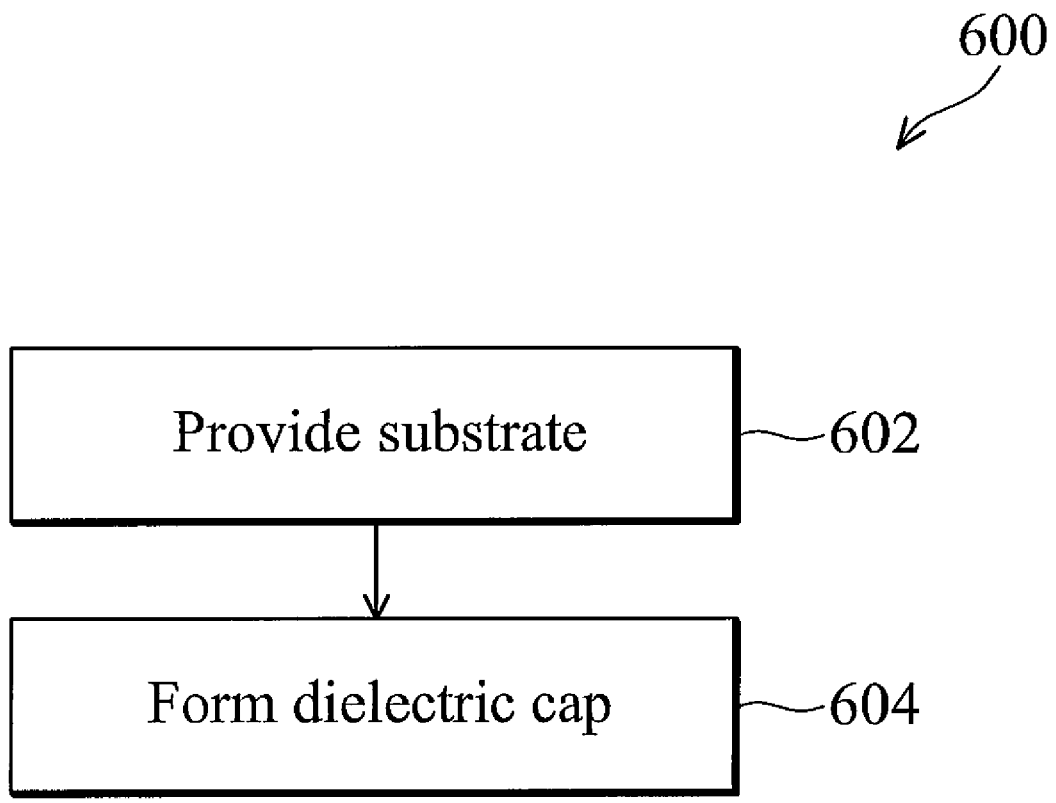
FIG. 6 illustrates a method in accordance with another embodiment of forming a dielectric cap.

FIG. 6 illustrates another method 600 of forming a dielectric cap. The method 600 begins with providing a substrate at step 602. The substrate may be a partially fabricated semiconductor wafer. For instance, the substrate may be a silicon wafer that has been processed to include transistors and associated wiring circuitry. The provided substrate may have an exposed surface that is substantially planar, such as a surface produced by chemical mechanical polishing. An exposed surface of the substrate may have regions that contain copper and other regions that contain a dielectric material. For instance, the substrate may have recently completed a dual damascene process followed by chemical mechanical polishing. Together, the copper-containing regions and the dielectric regions may constitute an interconnect layer of metal wiring that electrically connects one or more locations on a lower layer in the substrate to one or more other locations on the same or a different layer.

In one embodiment, the copper-containing regions of the substrate's interconnect layer is copper. In another embodiment, the copper-containing regions may be a copper alloy. The dielectric regions may be silicon dioxide, doped silicon dioxide, or any other suitable material for electrically insulating the metal wiring paths of the interconnect layer. In one embodiment, the dielectric is a low-k silicon dioxide formed by implanting.

A copper surface of the substrate may also be substantially free of copper oxides. The substrate provided in step 602 may be provided in an oxygen-free atmosphere to prevent copper oxides from forming on an exposed copper surface of the substrate. For example, a prior fabrication processing step (not shown) could be performed using oxygen-free chemicals in an oxygen-free atmosphere. Then the substrate could be transferred under an inert gas or vacuum environment to prevent any copper oxides from forming in the interim.

The method 600 then continues in step 604, where a dielectric cap is formed. The dielectric cap may be formed almost exclusively over the copper-containing regions of the substrate so that the remaining portions of the exposed surface are not capped. For instance, the dielectric cap may not be formed over the dielectric regions of the exposed surface. The dielectric cap may be silicon nitride, silicon carbide, silicon carbon nitride, or any other suitable dielectric compound. The dielectric cap may be formed as previously discussed in step 506 of method 500. After step 604, the method 600 ends.

The present disclosure has been described relative to a preferred embodiment. Improvements or modifications that become apparent to persons of ordinary skill in the art only after reading this disclosure are deemed within the spirit and scope of the application. It is understood that several modifications, changes and substitutions are intended in the foregoing disclosure and in some instances some features of the invention will be employed without a corresponding use of other features. Accordingly, it is appropriate that the appended claims be construed broadly and in a manner consistent with the scope of the invention.

What is claimed is:

1. A method comprising:
   providing a substrate with a layer having at least a first region and a second region, wherein the first region comprises a first dielectric material and the second region comprises copper;
   treating the substrate in a reduced-oxygen environment to remove oxides of copper that may be in the second region; and forming a cap layer over the substrate, wherein the cap comprises a second dielectric material and is selectively formed only over the second region of the substrate such that substantially no second dielectric material is formed over the first region of the substrate, wherein the second dielectric material comprises a material selected from a group consisting of silicon nitride, silicon carbide, and silicon carbon nitride, and wherein the forming comprises using plasma enhanced chemical vapor deposition in an atmosphere comprising a silane and a precursor gas, the silane selected from the group consisting of $SiH_4$, $Si_2H_6$, and $Si_3H_8$, the precursor gas selected from a group consisting of $CH_4$, $C_2H_6$, $C_3H_8$, $N_2$, $NH_3$, and $N_2NH_3$.

2. The method of claim 1 further comprising:
forming an etch stop layer of SiCN.

3. The method of claim 1 wherein the atmosphere further comprises an nitrogen-containing compound.

4. The method of claim 3 wherein the nitrogen-containing compound is chosen from the group consisting of $N_2$, $N_2H_3$, and $NH_3$.

5. The method of claim 1 wherein a process pressure is between about 0.1 torr and about 10 torr.

6. The method of claim 1 wherein a process temperature is between about 200 degrees Celsius and about 400 degrees Celsius.

7. The method of claim 1 wherein a process time is between about 5 seconds and about 120 seconds.

8. The method of claim 1 wherein the second dielectric material comprises silicon and at least one chosen from the group consisting of carbon and nitrogen.

9. The method of claim 1 wherein treating the substrate comprises performing plasma etching to reduce copper oxides to copper.

10. The method of claim 9 wherein the plasma etching uses an enchant chosen from the group consisting of $H_2$, $N_2NH_3$, and $NH_3$.

11. The method of claim 1 wherein treating the substrate comprises performing a wet chemical etch.

12. The method of claim 1 further comprising depositing an etch stop layer over the cap layer.

13. The method of claim 12 wherein the etch stop layer comprises a material selected from the group consisting of: SiN, SiC, and SiCN.

14. The method of claim 1 wherein the steps of treating the substrate and forming the cap layer are performed in a same tool.

15. A method comprising:
providing a substrate with an exposed surface that is at least partly copper;
plasma etching the exposed surface of the substrate to chemically reduce copper oxides in the substrate to copper, the plasma etching being performed in a low-oxygen environment and in the presence of a hydrogen source selected from the group consisting of $H_2$, $NH_3$, and $N_2NH_3$; and
depositing a dielectric cap selectively and only over copper portions of the exposed surface of the substrate using plasma enhanced chemical vapor deposition in an atmosphere comprising a silane and a precursor gas, the silane selected from the group consisting of $SiH_4$, $Si_2H_6$, and $Si_3H_8$, the precursor gas selected from a group consisting of $CH_4$, $C_2H_6$, $C_3H_8$, $N_2$, $NH_3$, and $N_2NH_3$;
wherein the plasma etching step and the depositing step are performed in a same tool; and
wherein the dielectric cap comprises a material selected from a group consisting of silicon nitride, silicon carbide, and silicon carbon nitride.

16. The method of claim 15 wherein the atmosphere further comprises an nitrogen-containing compound.

17. The method of claim 16 wherein the nitrogen-containing compound is chosen from the group consisting of $N_2$, $N_2NH_3$, and $NH_3$.

18. The method of claim 15 wherein a process pressure is between about 0.1 torr and about 10 torr.

19. The method of claim 15 wherein a process temperature is between about 200 degrees Celsius and about 400 degrees Celsius.

20. The method of claim 15 wherein a process time is between about 5 seconds and about 120 seconds.

* * * * *